EPITAXIAL SEMICONDUCTOR LAYER AS A DIFFUSION MASK

Filed April 28, 1965

INVENTOR.
JOHN C. MARINACE
BY John F. Ohlandt Jr.
ATTORNEY

United States Patent Office 3,406,049

Patented Oct. 15, 1968

3,406,049

EPITAXIAL SEMICONDUCTOR LAYER AS A DIFFUSION MASK

John C. Marinace, Yorktown Heights, N.Y., assignor to International Business Machines Corporation, Armonk, N.Y., a corporation of New York Filed Apr. 28, 1965, Ser. No. 451,583

10 Claims. (Cl. 148—175)

ABSTRACT OF THE DISCLOSURE

A diffusion technique is described wherein a pattern of epitaxially grown semiconductor material formed on the surface of a wafer of different type semiconductor material is employed as a diffusion mask. The pattern of epitaxial material can be defined by initially providing a pattern of particular material on the wafer surface whereat diffusions are to be made and which is effective to mask against the epitaxial growth of semiconductor material. Such pattern of particular material can be subsequently removed or the diffusion of impurities can be effected therethrough. Additionally, by proper control of the diffusion parameters, the diffusion can be limited to penetrate at the interface between edges of the particular material and the epitaxial material such that a very narrow junction is formed in the wafer surface.

This invention relates to a semiconductor device fabrication method and, more particularly, to a diffusion technique involving the growth of a masking layer on a semiconductor substrate.

Various diffusion techniques have been employed in the past to make conventional diodes and transistors, as well as light emitting diode devices which radiate light incoherently or coherently. Electroluminescent and lasing diodes have been discussed in the literature. For example, reference may be had to an article by R. J. Keyes and T. M. Quist "Recombination Radiation Emitted by GaAs," Proceedings of the IRE, vol. 50, August 1962, page 1822.

In making the above noted electroluminescent diodes and lasers, it has become standard practice to employ a material such as GaAs and to diffuse an impurity into a wafer of this material to create the desired junction at which the electroluminescent or lasing action takes place. A very important diffusant for use in making GaAs devices of this character is zinc and the highest efficiency injection lasers and electroluminescent diodes have been fabricated from *n* type GaAs wafers which have been subjected to zinc diffusions. Zinc is a particularly useful diffusant because its diffusion coefficient is concentration-dependent; that is, at high concentrations zinc diffuses both substitutionally and interstitially, which allows rapid diffusions at relatively low temperatures.

$SiO_2$ films, the usual standard diffusion mask in semiconductor technologies, have been used on GaAs as diffusion masks against zinc. However, only partial success has been achieved in the aforenoted cases of lasers or electroluminescent diodes where relatively deep diffusions are desired. $SiO_2$, conventionally applied by evaporation, pyrolysis or sputtering, is not a very efficacious mask in these cases; while it hinders the diffusion of zinc, it very rarely, if ever, completely masks it, even in diffusion runs of short duration or low temperature. There results in these cases the extension of a junction under the $SiO_2$ mask due to the failure of the $SiO_2$ mask to completely stop the zinc diffusion.

It is, therefore, the primary object of the present invention to provide a diffusion masking technique which solves the aforenoted problem.

Another object is to provide a mask on a semiconductor substrate which will completely block normal diffusion into the substrate.

A further object is to provide a sharply defined junction within a semiconductor wafer by confining the penetration of the diffusant therein.

It has been discovered that a thick layer of a crystallographically compatible semiconductor material, which can be vapor grown epitaxially relatively easily upon a substrate, can serve as a diffusion mask on the surface of the substrate. More particularly, the epitaxially compatible semiconductor materials, Ge and GaAs, can be used in this fashion with Ge serving as the diffusion mask on the surface of the GaAs. A major advantage, therefore, of the technique of the present invention is that the diffusion coefficient for the selected masking material can be high but by virtue of the exploitation of epitaxial growth the masking film can be made thick enough, despite the high diffusion coefficient, to accomplish the purpose of blocking the diffusant. The semiconductor masking material can subsequently be removed by the use of an etchant that is preferential in its action between the two distinct semiconductor materials, as will be described hereinafter.

It should be noted that the specific case of Ge serving as the diffusion mask is not limiting as to the scope of the present invention, since, as will be appreciated by workers in the art, the principle of the discovery may be applied by using other semiconductors in an epitaxial relationship with one serving as the diffusion mask on another.

The foregoing and other objects, features and advantages of the invention will be described in detail with reference to preferred embodiments as illustrated in the following drawings:

Figure 3A:
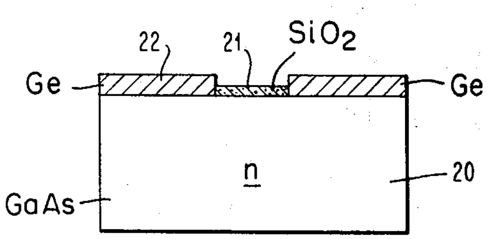
Figure 3B:
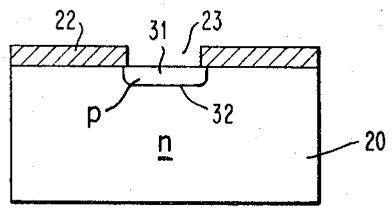
Figure 3C:
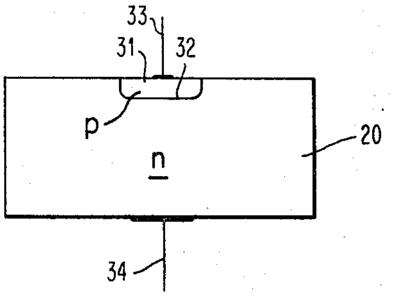

FIGURES 3*a*, 3*b* and 3*c* show various steps of the fabrication technique of the present invention.

Figure 1:
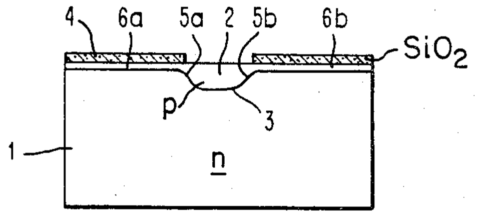
FIG. 1 PRIOR ART
FIGURE 1 is a cross-sectional view of a cleaved edge of an *n* type GaAs wafer depicting prior art effects.

Referring now to the figures, there is shown in FIGURE 1 a device, made according to prior art techniques, consisting of a GaAs wafer 1 of n conductivity type and having therein an opposite conductivity type diffused region 2 defining a p-n junction 3 within the wafer. The top surface of the wafer is shown masked by the use of an $SiO_2$ layer 4, having a thickness of approximately 10,000 A., except for slots, which are approximately .001 inch wide, into which the zinc diffusion has taken place, in accordance with the standard prior art technique. In practice, the junction is delineated by immersion into 10:1:1::$H_2O$:$H_2O_2$:HF for 10 seconds with a strong light. In addition to the normal diffusion, there is such rapid diffusion along the interface between the GaAs and the $SiO_2$ that diffusion regions **5*a* and 5*b* are produced. There is also some penetration of the zinc through the masked portions of the $SiO_2$ such that the regions 6*a* and 6*b*** are also produced.

Figure 2:
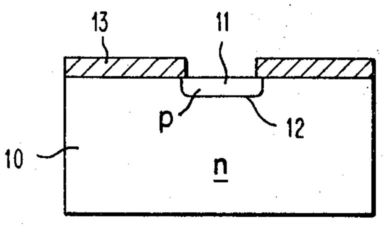
FIGURE 2 is a cross-sectional view of a typical diffused junction in accordance with the present invention.

Referring now to FIGURE 2, there is shown a similar wafer 10 having therein an opposite conductivity type diffused region 11 defining a junction 12 within the wafer. However, in this case, because of the fabrication technique of the present invention involving the use of an epitaxial semiconductor mask 13, there is minimal diffusion along the interface and none through the mask. A sharply defined junction results from the confined penetration of the diffusant.

The procedure for attaining the sharply defined junction 12 is as follows, referring now to FIGURES 3*a*, 3*b* and 3*c*. In FIGURE 3*a*, the GaAs wafer 20 is shown and this is merely a typical wafer, which may also be considered as a portion of a much larger wafer on which there is formed a plurality of diffused junctions to create integrated arrays of devices. In order to produce the desired pattern for the zinc diffusion and, hence, for the deposition of the epitaxial Ge layer, a straightforward way is to deposit on the entire surface 5,000 to 10,000 A. of $SiO_2$. Then, by use of conventional photolithographic techniques, well understood by workers in the art, selected areas of the $SiO_2$ are left on the surface corresponding to the areas for diffusion. A typical area 21 is shown in the cross-sectional view of FIGURE 3*a*. Then the layer 22 of Ge is epitaxially grown over the entire surface except where the $SiO_2$ layer 21 remains.

The Ge deposition is most conveniently accomplished by using a known, low temperature, open cycle Ge-$I_2$ disproportionation process. By this process epitaxial layer 22 is deposited to have a thickness of approximately 4 microns or more. For further details of the disproportionation process reference may be made to an article "Vapor Deposited Single Crystal Ge" by R. P. Ruth et al., Journal of Applied Physics, vol. 31, No. 6, p. 995, June 1960. The wafer 20 is then treated by immersion in hydrogen fluoride for approximately 30 minutes to remove the $SiO_2$ layer 21 which constitutes the mask against the epitaxial growth of the Ge layer 22. The diffusion step is then preferably carried out through the opening 23 following removal of the $SiO_2$. As one example, the typical wafer 20 is sealed in a silica tube (having dimensions of 11 millimeters inside diameter by 75 millimeters in length). Also sealed in the tube is a diffusant charge of 5–10 mg. of zinc arsenide ($ZnAs_2$) as the Zn diffusion source. The tube is sealed at a pressure of approximately $10^{-6}$ mm. of Hg. The tube is then placed in a furnace at a temperature of 670° C. for 16 hours, resulting in the conversion of the exposed area within the wafer 20 to produce the opposite conductivity type region 31. For the combination of Ge and GaAs the maximum diffusion temperature was found to lie between 750° C. and 800° C. The junction 32 is treated as described earlier. It is to be noted that the junction 32 is practically normal to the interface between the GaAs and the Ge indicating little or no preferential diffusion along the interface between these materials. (Delineation is not normally part of the device fabrication procedure and thus is not essential to the technique of the present invention.)

The wafer 20 is then immersed in 30% $H_2O_2$, which causes the Ge to dissolve slowly but the GaAs much more slowly, if at all. Thus, there results the final configuration shown in FIGURE 3*c* with the Ge completely removed. At room temperatures the Ge is removed at the rate of approximately 1 micron per hour; at elevated temperatures the removal rate is greatly increased. Leads 33 and 34 are shown attached to the respective p and n regions of the diode for circuit connecting purposes.

It should be noted that, if desired, the $SiO_2$ film 21 may be left in the slots of the Ge mask; that is, the removal need not be accomplished as depicted in FIGURE 3*b*. Rather, the diffusion can be carried out through the $SiO_2$ film 21. Several runs were made using the latter technique of leaving the $SiO_2$ film on the surface. By carrying out diffusion for 16 hours at 670° C. with the latter arrangement, the Zn was found to have slightly penetrated through the $SiO_2$ but at the interface between the $SiO_2$ and the Ge the Zn penetrated readily. This permits the possibility of very narrow junctions when desired. Thus, by suitable control of the diffusion parameters the action of the diffusant is limited to the ready penetration at the interface so that a junction is defined precisely at that location.

What has been disclosed herein is a novel technique for the efficacious masking of a semiconductor substrate by means of the epitaxial growth of another semiconductor on the surface of the substrate. In this way, relatively thick films can be grown which effectively block undesired diffusion and promote the attainment of sharply defined junctions within the substrate. These junctions are thus properly confined for limiting the electroluminescent action in the case of a light-emitting diode to the desired regions of the substrate.

Although the example of the employment of the two semiconductor materials Ge and GaAs has been described in detail, it will be appreciated, as noted previously, that other combinations of compatible semiconductor materials may be used. As another typical example, the materials Si and GaP can be utilied together to achieve the fundamental purposes of the present invention. Thus, following the basic techniques described, a silicon masking layer would be formed on a gallium phosphide substrate by a conventional disproportionation reaction. The diffusion operation would be performed at a slightly higher temperature than for the case of gallium arsenide.

While the invention has been particularly shown and described with reference to preferred embodiments thereof, it will be understood by those skilled in the art that various changes in form and details may be made therein without departing from the spirit and scope of the invention.

What is claimed is:

1. A process for fabricating semiconductor devices involving the diffusion of an impurity into the surface of a semiconductor wafer of first conductivity type to create regions of second conductivity type therein comprising the steps of:

epitaxially growing a pattern of crystallographically compatible semiconductor material on said surface, except at selected surface areas so as to form a diffusion masking layer, said material being free of said impurity and being different from said wafer.

diffusing said impurity into the surface of said wafer at said selected areas to define at least one region of second conductivity type, said epitaxially grown semiconductor material being of sufficient thickness to block said impurity material, removing said masking layer by selectively etching said epitaxially grown semiconductor material from the surface of said wafer, and attaching contacts to said one region of opposite conductivity type and to the bulk of said wafer.

2. A process for fabricating semiconductor devices involving the diffusion of an impurity into the surface of a semiconductor wafer comprising the steps of:

covering the entire surface of said wafer with a thin film of particular material effective to mask against epitaxial growth on the surface of said wafer, selectively removing portions of said film of particular material so as to expose selected surface portions of said wafer, epitaxially growing crystallographically compatible semiconductor material on selected surface portions to define a diffusion masking layer, and diffusing an impurity material into the surface portions of said wafer through said thin film of particular material, said epitaxially grown semiconductor material being of sufficient thickness to block said impurity material.

3. The process as defined in claim 2 wherein the first formed film is $SiO_2$ and the wafer is constituted of GaAs.

4. The process as defined in claim 3 wherein the epitaxially grown masking layer is composed of Ge and the diffusion impurity is Zn.

5. A process for fabricating semiconductor devices involving the diffusion of an impurity material into the surface of a wafer of first conductivity type comprising the steps of:

forming a film of particular material effective to mask against epitaxial growth at selected areas on the surface of said wafer, epitaxially growing crystallographically compatible semiconductor material on said surface, except at said selected areas, to form a masking layer, removing the film of particular material from said surface thereby leaving openings in said epitaxially grown masking layer, diffusing an impurity material through the openings to define at least one region of second conductivity type at the surface of said wafer, said epitaxially grown masking layer being of sufficient thickness to block said impurity material.

6. A process for fabricating semiconductor devices involving the diffusion of an impurity material into the surface of a semiconductor wafer of first conductivity type comprising the steps of:

forming a thin film of particular material effective to mask against epitaxial growth at selected areas on the surface of said wafer, epitaxially growing crystallographically compatible semiconductor material on said surface, except at said selected areas, to form a masking layer, removing said thin film from said surface thereby leaving openings in said epitaxially grown masking layer, diffusing an impurity material through the openings to define at least one region of second conductivity type at the surface of said wafer, removing the epitaxially grown masking layer, and attaching contacts to said at least one opposite conductivity region of second conductivity type at said surface and to the bulk of said wafer.

7. The process as defined in claim 6 wherein the first formed film is $SiO_2$ and the wafer is constituted of GaAs.

8. The process as defined in claim 7 wherein the epitaxially grown masking layer is composed of Ge and the diffusion impurity is Zn.

9. A process for fabricating semiconductor devices involving the diffusion of an impurity material into the surface of a semiconductor wafer comprising the steps of:

forming a film of first material at selected areas on the surface of said semiconductor wafer, epitaxially growing a layer of different semiconductor material on said surface of said wafer except at said selected areas, said semiconductor material being crystallographically compatible only with said semiconductor wafer, edges of said film of first material and said epitaxially grown semiconductor material defining at least one interface substantially perpendicular to the surface of said semiconductor wafer, and diffusing an impurity material into the surface of said wafer along said one interface defined between the edges of said film of first material and said epitaxially grown semiconductor material, said film of first material and said epitaxially grown pattern of semiconductor material each being of sufficient thickness to block said impurity material.

10. A process for fabricating semiconductor devices involving the diffusion of zinc into the surface of a GaAs wafer comprising the steps of:

epitaxially growing a pattern of Ge onto the surface of said GaAs wafer, except at selected surface areas, so as to form a diffusion masking layer, and diffusing zinc into the surface of said GaAs wafer at said selected surface areas, said epitaxially grown pattern being of sufficient thickness to block said zinc.

References Cited

UNITED STATES PATENTS

| | | | |
|---|---|---|---|
| 3,165,430 | 1/1965 | Hugle | 148—187 |
| 3,171,762 | 3/1965 | Rutz | 148—175 |
| 3,183,129 | 5/1965 | Tripp | 148—187 X |
| 3,275,910 | 9/1966 | Phillips. | |
| 3,299,330 | 1/1967 | Watanabe | 148—175 X |
| 3,243,323 | 3/1966 | Corrigan | 148—175 |

HYLAND BIZOT, *Primary Examiner*.